(12) United States Patent
Lim et al.

(10) Patent No.: US 9,508,615 B2
(45) Date of Patent: Nov. 29, 2016

(54) CLOCK TREE SYNTHESIS FOR LOW COST PRE-BOND TESTING OF 3D INTEGRATED CIRCUITS

(71) Applicant: QUALCOMM Incorporated, San Diego, CA (US)

(72) Inventors: Sung Kyu Lim, Duluth, GA (US); Kambiz Samadi, San Diego, CA (US); Pratyush Kamal, San Diego, CA (US); Yang Du, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 110 days.

(21) Appl. No.: 14/617,901

(22) Filed: Feb. 9, 2015

(65) Prior Publication Data

US 2016/0233134 A1    Aug. 11, 2016

(51) Int. Cl.
| | |
|---|---|
| H01L 23/58 | (2006.01) |
| H01L 21/66 | (2006.01) |
| H01L 25/065 | (2006.01) |
| H01L 25/00 | (2006.01) |
| H01L 23/538 | (2006.01) |

(52) U.S. Cl.
CPC .............. *H01L 22/20* (2013.01); *H01L 22/32* (2013.01); *H01L 23/5382* (2013.01); *H01L 23/5384* (2013.01); *H01L 25/0657* (2013.01); *H01L 25/50* (2013.01); *H01L 2225/06527* (2013.01); *H01L 2225/06544* (2013.01); *H01L 2225/06596* (2013.01)

(58) Field of Classification Search
None
See application file for complete search history.

(56) References Cited

U.S. PATENT DOCUMENTS

| | | |
|---|---|---|
| 8,782,479 B2 | 7/2014 | Chakrabarty et al. |
| 2012/0248438 A1* | 10/2012 | Lung ................... H01L 25/0657 257/48 |
| 2013/0024737 A1 | 1/2013 | Marinissen et al. |
| 2014/0145347 A1 | 5/2014 | Samadi et al. |

FOREIGN PATENT DOCUMENTS

WO    2013004836 A1    1/2013

OTHER PUBLICATIONS

Kim T.Y., et al., "Clock Tree Synthesis with Pre-bond Testability for 3D Stacked IC Designs," 47th ACM/IEEE Design Automation Conference (DAC), Jun. 2010, pp. 723-728. Wang S.J., et al., "Synthesis of 3D Clock Tree with Pre-bond Testability," IEEE International Symposium on Circuits and Systems (ISCAS), May 2013, pp. 2654-2657.
Zhao X., et al., "Low-Power Clock Tree Design for Pre-Bond Testing of 3-D Stacked ICs", IEEE Transactions on computer-aided design of integrated circuits and systems, vol. 30, No. 5, May 2011, pp. 732-745.

* cited by examiner

*Primary Examiner* — Ali Naraghi
(74) *Attorney, Agent, or Firm* — Muncy, Geissler, Olds & Lowe, P.C.

(57) ABSTRACT

To enable low cost pre-bond testing for a three-dimensional (3D) integrated circuit, a backbone die may have a fully connected two-dimensional (2D) clock tree and one or more non-backbone die may have multiple isolated 2D clock trees. In various embodiments, clock sinks on the backbone die and the non-backbone die can be connected using multiple through-silicon-vias and the isolated 2D clock trees in the non-backbone die can be further connected via a Detachable tree (D-tree), which may comprise a rectilinear minimum spanning tree representing a shortest interconnect among the sinks associated with the 2D clock trees in the non-backbone die. Accordingly, the backbone die and the non-backbone die can be separated and individually tested prior to bonding using one clock probe pad, and the D-tree may be easily removed from the non-backbone die subsequent to the pre-bond testing by burning fuses at the sinks associated with the 2D clock trees.

20 Claims, 8 Drawing Sheets overall tree topology

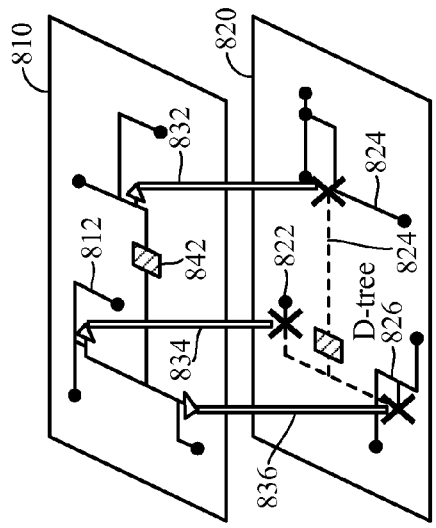
FIG. 8A
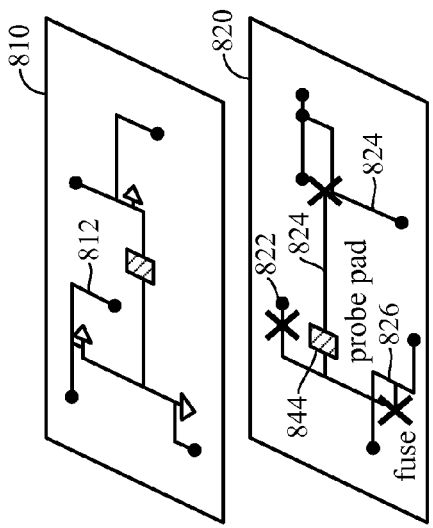
FIG. 8B
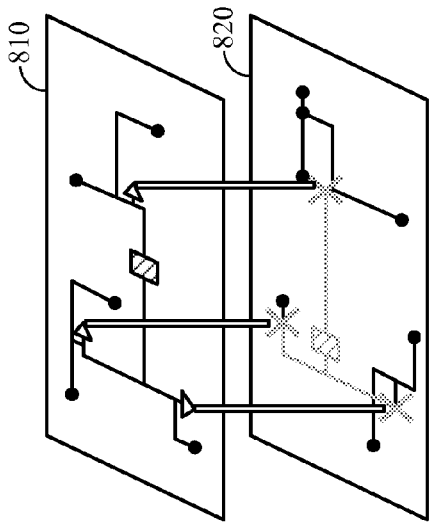
FIG. 8C
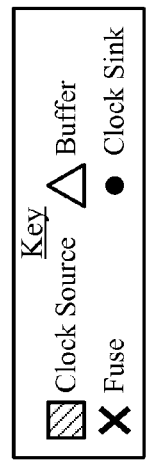

CLOCK TREE SYNTHESIS FOR LOW COST PRE-BOND TESTING OF 3D INTEGRATED CIRCUITS

TECHNICAL FIELD

The disclosure generally relates to integrated circuits, and in particular, to clock tree synthesis that can reduce the cost to pre-bond test 3D integrated circuits.

BACKGROUND

Three-dimensional (3D) system integration has emerged as a key enabling technology to continue the scaling trajectory that Moore's Law predicted for future integrated circuit (IC) generations. More particularly, with 3D integration technology, components in a stacked IC can be placed on different dies, which can substantially reduce both the average and maximum distance between the components in the stacked IC and translate into significant savings in delay, power, and area footprint. Furthermore, 3D integration technology can enable the integration of heterogeneous devices, thereby making the entire system more compact and more efficient. Nevertheless, the success of 3D stacked ICs is predicated on the final post-bond yield, i.e., minimizing the number of good dies that are bonded to defective dies. As such, the overall yield of 3D ICs improves with pre-bond testing, which involves testing each individual die in a 3D stacked IC prior to the bonding process, because manufacturers can avoid stacking defective dies with good dies.

However, pre-bond testability presents unique challenges to 3D clock tree design. For example, each individual die in a 3D stacked IC generally needs a complete 2D clock tree to enable pre-bond testing because the clock signal has to reliably span across multiple tiers under tight skew and slew constraints. Furthermore, the entire 3D stack needs a complete 3D clock tree for post-bond testing and post-bond operation. A straightforward solution may simply have a complete 2D clock tree on each individual die and use a single through-silicon-via (TSV) to connect the 2D clock trees on adjacent die. However, the single TSV solution suffers from various drawbacks, which include long wirelength (WL) and high clock power consumption because more buffers are needed. Further, in a 3D stacked IC where one backbone die has a single large clock tree and all other dies have multiple small trees that are not connected to one another, the backbone die with the single tree needs only one clock probe during pre-bond testing, but all other dies need multiple probes, which can complicate testing. Another proposed approach to the pre-bond testing problem in 3D stacked ICs uses multiple TSVs to connect the backbone die to the non-backbone die and adding an extra redundant tree (or R-Tree) to connect the small trees in the non-backbone die such that a single clock probe can be used for pre-bond testing. Although the R-tree may simplify pre-bond testability, the R-tree tends to have a significant design-for-testing (DFT) cost because transmission gates are used to detach the R-tree from the small trees after pre-bond testing, which requires an extra global connection to turn off the transmission gates, thereby adding to the total DFT cost.

SUMMARY

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments disclosed herein in a simplified form to precede the detailed description presented below.

According to various aspects, to enable low cost pre-bond testing for a three-dimensional (3D) integrated circuit, a fully connected two-dimensional (2D) clock tree may be built on a backbone die and multiple isolated 2D clock trees may be built on one or more non-backbone die. In various embodiments, clock sinks associated with the backbone die and the non-backbone die can be connected to one another using multiple through-silicon-vias (TSVs) and the multiple isolated 2D clock trees in each non-backbone die can be further connected to one another using a Detachable tree (D-tree). For example, in various embodiments, the D-tree may comprise a rectilinear minimum spanning tree (RMST) that represents a shortest interconnect among the clock sinks associated with the isolated 2D clock trees in the non-backbone die (e.g., a non-buffered Steiner tree that can be built using a Steiner router configured to minimize wirelength and buffer overhead associated with the D-tree). Accordingly, the backbone die and the non-backbone die can be separated and individually tested prior to bonding using a single clock probe pad, and subsequent to the pre-bond testing, fuses at the sinks associated with the 2D clock trees can be burnt to easily remove the D-tree from the non-backbone die for post-bond operation.

According to various aspects, a method for pre-bond testing a 3D integrated circuit may comprise building a fully connected two-dimensional (2D) clock tree on a backbone die, building multiple isolated 2D clock trees on one or more non-backbone die, wherein multiple through-silicon-vias may connect the 2D clock tree in the backbone die and the multiple isolated 2D clock trees in the one or more non-backbone die, and connecting the multiple isolated 2D clock trees in the one or more non-backbone die using a Detachable tree (D-tree), wherein the D-tree may comprise a root node and fuses located at sinks associated with the isolated 2D clock trees. Accordingly, a single clock probe pad may be used to pre-bond test the backbone die and the one or more non-backbone die, which may be separated and tested individually during the pre-bond testing, and the fuses associated with the D-tree may be burned subsequent to the pre-bond testing to remove the D-tree from the one or more non-backbone die (e.g., for post-bond testing and operation).

According to various aspects, a 3D stacked integrated circuit may comprise a backbone die having a clock source and a fully connected 2D clock tree, one or more non-backbone die that each comprise multiple isolated 2D clock trees that are connected to one another with a D-tree, wherein the D-tree may comprise a single clock probe pad and fuses attached at sinks associated with the isolated 2D clock trees, and multiple through-silicon-vias that connect the fully connected 2D clock tree in the backbone die to the multiple isolated 2D clock trees in the one or more non-backbone die. Accordingly, the single clock probe pad associated with the D-tree may be used to pre-bond test the one or more non-backbone die, and the fuses associated with the D-tree may be burned subsequent to the pre-bond test to remove the D-tree from the one or more non-backbone die.

According to various aspects, a 3D stacked integrated circuit may comprise a first die having a fully connected two-dimensional (2D) clock tree and a second die bonded to the first die, wherein the second die may comprise multiple isolated 2D clock trees that are connected to the fully connected 2D clock tree in the first die using multiple through-silicon-vias and a non-buffered clock tree that has one or more burned fuses, which may be located at sinks associated with the multiple isolated 2D clock trees in the second die or at internal nodes associated with the non-buffered clock tree.

Other objects and advantages associated with the various aspects and/or embodiments disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which:

FIG. 3 illustrates an exemplary 3D stacked IC in which each die has a fully connected 2D clock tree and a single through-silicon-via (TSV) connects the clock trees in adjacent dies, while

FIGS. 8A-8C illustrate an exemplary overall topology, pre-bond test topology, and post-bond operation topology associated with a two-die stacked IC that uses a D-tree to enable low cost pre-bond testing.

DETAILED DESCRIPTION

Various aspects are disclosed in the following description and related drawings to show examples directed to specific exemplary embodiments. Alternate embodiments will be apparent to those skilled in the pertinent art upon reading this disclosure, and may be constructed and practiced without departing from the scope or spirit of the disclosure. Additionally, well-known elements will not be described in detail or may be omitted so as to not obscure the relevant details of the aspects and embodiments disclosed herein.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage, or mode of operation.

The terminology used herein describes particular embodiments only and should be construed to limit any embodiments disclosed herein. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Further, many aspects are described in terms of sequences of actions to be performed by, for example, elements of a computing device. It will be recognized that various actions described herein can be performed by specific circuits (e.g., an application specific integrated circuit (ASIC)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each aspect and/or embodiment described herein, the corresponding form of any such aspect and/or embodiment may be described herein as, for example, "logic configured to" perform the described action.

Figure 1:
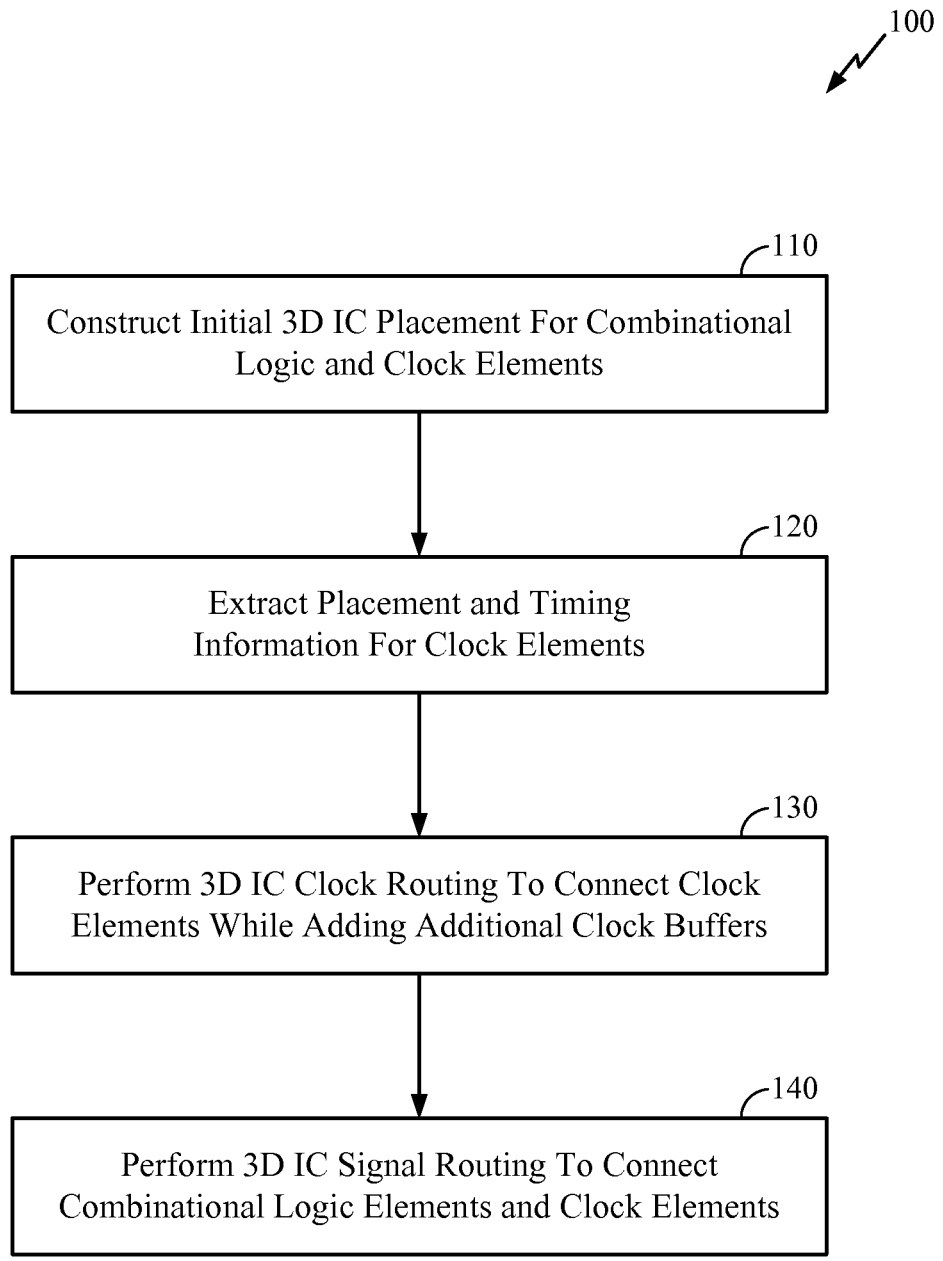
FIG. 1 illustrates an exemplary method for constructing a three-dimensional (3D) clock tree that may enable low cost pre-bond testing of a 3D stacked integrated circuit (IC).

According to various embodiments, FIG. 1 illustrates an exemplary method 100 for constructing a 3D clock tree that may enable low cost pre-bond testing of a 3D stacked integrated circuit (IC). In particular, the method 100 may be used to develop a clock distribution network (CDN) that can tightly control clock timing and build that the clock timing into an overall 3D stacked IC design, wherein the 3D stacked IC may include digital components, analog components, or a combination thereof. Furthermore, any references in the present disclosure to "logic" circuitry is intended to cover digital circuit components, analog circuit components, and combinations thereof. In various embodiments, at block 110, an operation may be performed to construct an initial 3D IC placement for one or more combinational logic elements and one or more clock elements, wherein the clock elements may generally comprise a clock source and one or more clock sinks. In various embodiments, block 110 may comprise synthesizing a high-level behavioral description into complex logic circuits that perform the operations described in the high-level behavioral description. For example, in various embodiments, the high-level behavioral description may be implemented as a Register Transfer Level (RTL) description that can be mapped to a library of gates, wherein the RTL description may describe registers associated with a circuit and a sequence of transfers between the registers.

In various embodiments, at block 120, placement and timing information for the one or more clock elements that were placed at block 110 may be extracted, wherein the extracted timing information may comprise CDN timing information captured from the high-level behavioral description. In various embodiments, at block 130, 3D IC clock routing may be performed to connect the clock elements while adding one or more additional clock buffers. For example, the CDN may include the clock elements (e.g., clock generation circuitry, clock source, clock sinks, etc.), any additional clock buffers that are added, and appropriate wiring, which may be connected to one another separate from the combinational logic elements placed at block 110. Accordingly, due to separation of the CDN from the rest of the combinational logic elements, the separated CDN may cover a smaller footprint, have less buffers, less wiring (and therefore reduced wirelength), and reduced power, Furthermore, separating the CDN from the remaining combinational logic elements may reduce the complexity of the combinational logic elements for better routablility, reduced wirelength, increased performance, and reduced power consumption. In various embodiments, at block 140, 3D IC signal routing may be performed to connect the combinational logic elements and further to connect the clock elements to the combinational logic elements, wherein the 3D IC signal routing performed at block 140 techniques may be 2D and/or 3D. Furthermore, the 3D IC signal routing performed at block 140 may comprise mapping one or more through-silicon-vias (TSVs) to connect one or more clock elements to corresponding combinational logic elements.

Accordingly, the above-described techniques that may be used to design a 3D stacked IC may provide various benefits. For example, one tier in the multi-tier (stacked) 3D IC design may be primarily dedicated to housing the CDN, which may substantially eliminate or at least reduce the need to design a clock tree for each tier in the 3D stacked IC, thereby reducing design complexity. Furthermore, the above-described design techniques may result in fewer metal layers, which can save costs compared with known 3D IC design techniques. Further still, the smaller CDN area footprint may result in less clock power (e.g., an approximately 30% power reduction), which may result in shorter wires and fewer buffers. The resulting clock tree design may also be cleaner because all clock sinks and the CDN (which includes the clock buffers) reside on one tier (e.g., a backbone tier) and the separated CDN may be significantly more robust against process variation (even more than 2D due to the smaller footprint). Moreover, wirelength may be reduced due to the logic tier having less logic complexity, which may result in improved performance and improved timing closure, design complexity may be reduced because existing 2D timing optimization engines can be used in embodiments where there are no 3D nets with respect to timing optimization, scan chain routing may be simplified because there may be no need to go through the logic tier. Additionally, where the existing sequential (non-memory) takes up approximately half the design area versus combinational cells, there may be easy balancing between tiers.

Figure 2:
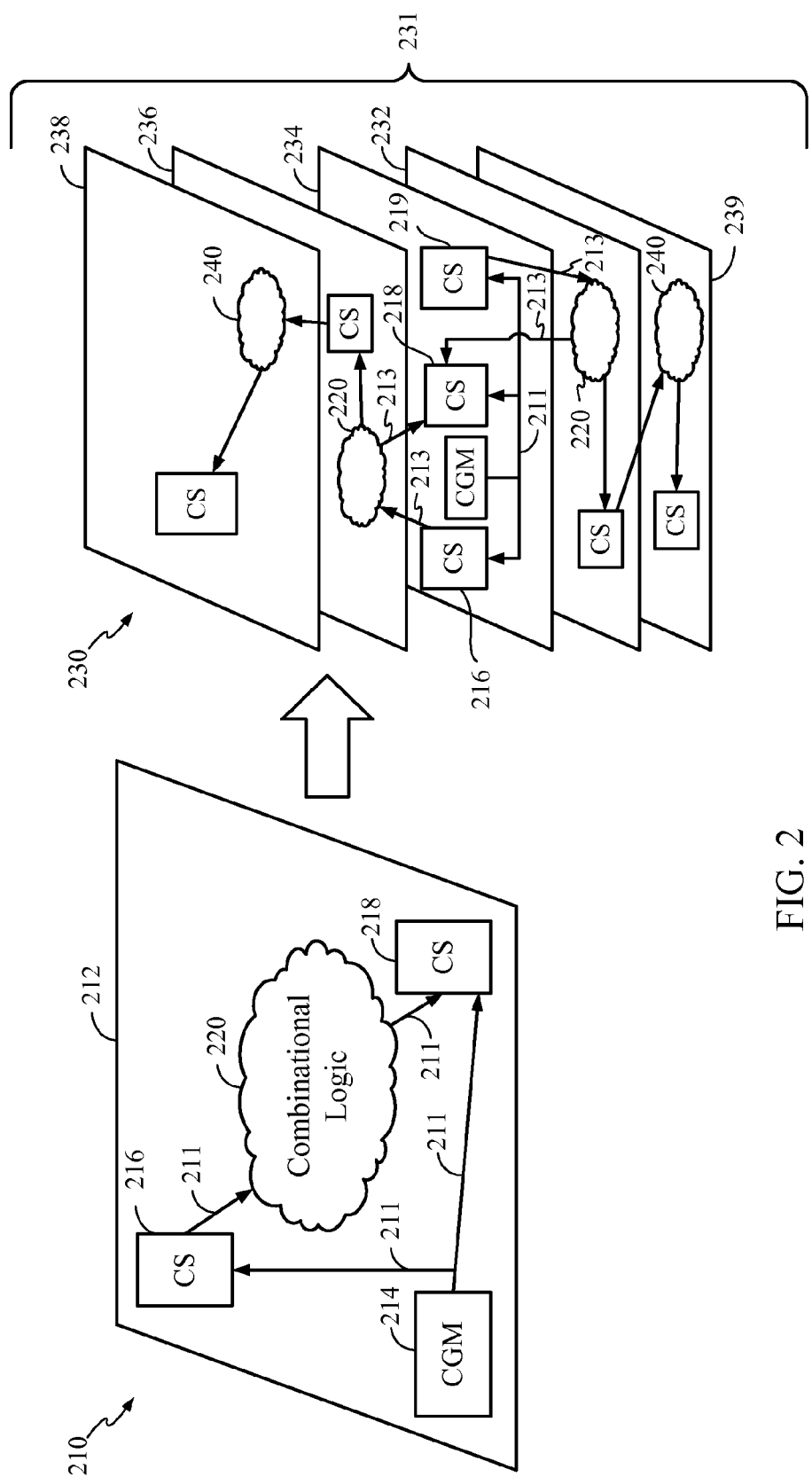
FIG. 2 illustrates an exemplary layout associated with a 3D stacked IC constructed according to the design methodology shown in FIG. 1.

According to various embodiments, FIG. 2 illustrates an exemplary layout associated with a 3D stacked IC constructed according to the design methodology described above. In particular, FIG. 2 represents a general configuration broadly representing certain circuitry/elements (e.g., clock generation, wiring, combinational logic elements, clock sinks, etc.), but is not intended to convey a particular circuit example. In various embodiments, FIG. 2 shows an example 2D timing arc 210 and an example 3D timing arc 230, wherein the 2D timing arc 210 includes a clock generation module (CGM) 214, a launch clock sink 216, a capture clock sink 218, wiring 211, and combinational logic elements 220, which may all be arranged and dispersed throughout a single 2D tier 212. In practice, the CGM 214 could be implemented as phase lock loop circuitry, and clock sinks 216, 218 could be implemented as flip-flop circuitry, clock input pins, intellectual property (IP) blocks, memory blocks, or other suitable clock sinks. In general, the 2D timing arc 210 and the 3D timing arc 230 may accurately capture critical sources of clock skew, which may include design and/or delay mismatches from the launch clock sink 216 to the capture clock sink 218. Accordingly, as shown in FIG. 2, the clock timing requirements may be tightly controlled and built into the overall IC design.

In various embodiments, the 3D timing arc 230 illustrates a multi-tier 3D IC 231 in which the CDN (e.g., CGM 214, wiring 211, clock sinks 216, 218, 219, etc.) may be spread across various tiers 232, 234, 236, 238, 239, the CGM 214 may be separated onto a single tier 234. Furthermore, one or more timing critical combinational logic elements 220 can be placed after the CDN has been separated across the various tiers 232, 234, 236, 238, 239, and to the extent that the tier 234 having the CGM 214 has sufficient room, some or all of the timing-critical combinational logic elements 220 may be placed on the same tier 234. Accordingly, in various embodiments, the timing-critical combinational logic elements 220 may be placed on the CGM tier 234 to the extent that room may be available, or the timing-critical combinational logic elements 220 may alternatively be placed on adjacent tier 232 or adjacent tier 236. Furthermore, non-timing-critical combinational logic elements 240 may also be placed on tier 234 to the extent that room may be available after the CGM 214 and any timing-critical combinational logic elements 220 have been placed, or the non-timing-critical combinational logic elements 240 may alternatively be placed on any other tier 232, 236, 238, 239, etc. whether or not adjacent to tier 234. Additionally, one or more through-silicon-vias (TSVs) 213 may be built into the multi-tier circuit 231 to connect the clock sinks 216, 218, 219 to the combinational logic elements 220, 240 on adjacent tiers, whereby each combinational logic element 220, 240 may have an incoming clock source and an outgoing clock sink. In other words, the 3D timing arc 230 uses various wires and TSVs 213 to connect the clock sinks 216, 218, 219 that are spread across the various tiers.

Furthermore, the 3D timing arc 230 shown in FIG. 2 further illustrates that the multi-tier circuit 231 may be scalable to larger and larger 3D stacked ICs provided that the CDN is separated to as many tiers as may be needed to accommodate the size of the CDN. Similarly, as the timing-critical combinational logic elements 220 increase in size, additional tiers that are either a CDN tier or adjacent to a CDN tier may be added to accommodate the larger timing-critical combinational logic elements, and as the non-timing-critical combinational logic elements 240 increase in size, additional tiers may also be added to accommodate the larger non-timing-critical combinational logic elements.

Figure 3:
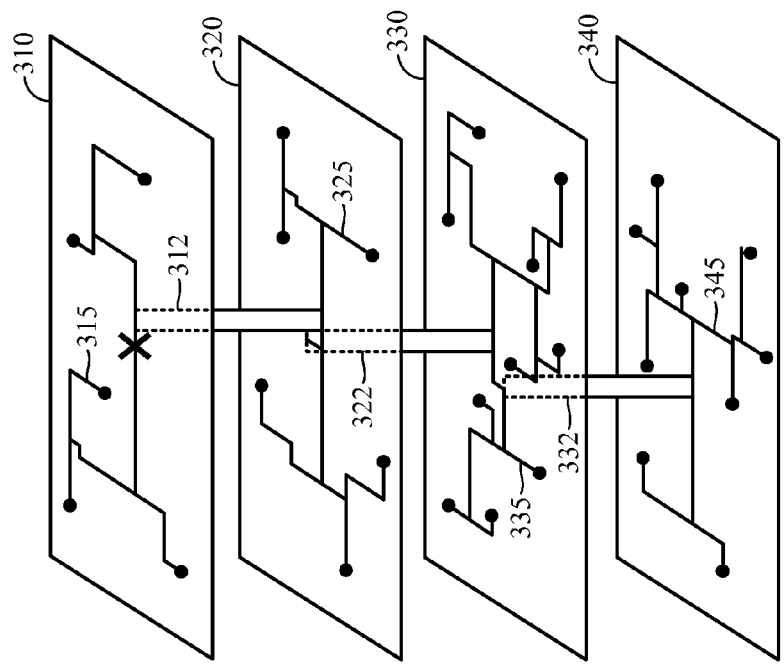

According to various embodiments, the following description provides a 3D clock tree synthesis design that may enable low power and low cost pre-bond testing of 3D stacked ICs. More particularly, pre-bond testing presents unique challenges to 3D clock tree design because the clock signal has to reliably span across multiple tiers under tight skew and slew constraints such that each individual die in a 3D stacked IC needs a complete 2D clock tree to enable pre-bond testing. Furthermore, the entire 3D stack needs a complete 3D clock tree to support post-bond testing and post-bond operation. In that context, a straightforward solution is to have a complete 2D clock tree on each individual die with a single through-silicon-via (TSV) connecting the 2D clock trees on adjacent die. For example, FIG. 3 illustrates a four-die stack in which each individual die 310, 320, 330, 340 has a fully connected 2D clock tree 315, 325, 335, 345, a single TSV 312 connects the clock trees 315, 325 on dies 310, 320, a single TSV 322 connects the clock trees 325, 335 on dies 320, 330, and a single TSV 332 connects the clock trees 335, 345 on dies 330, 340. Although the single TSV approach shown in FIG. 3 may allow pre-bond testing using one probe pad per each individual die 310, 320, 330, 340, the single TSV approach shown in FIG. 3 suffers from long wirelength, more buffers, and high clock power consumption.

Figure 4:
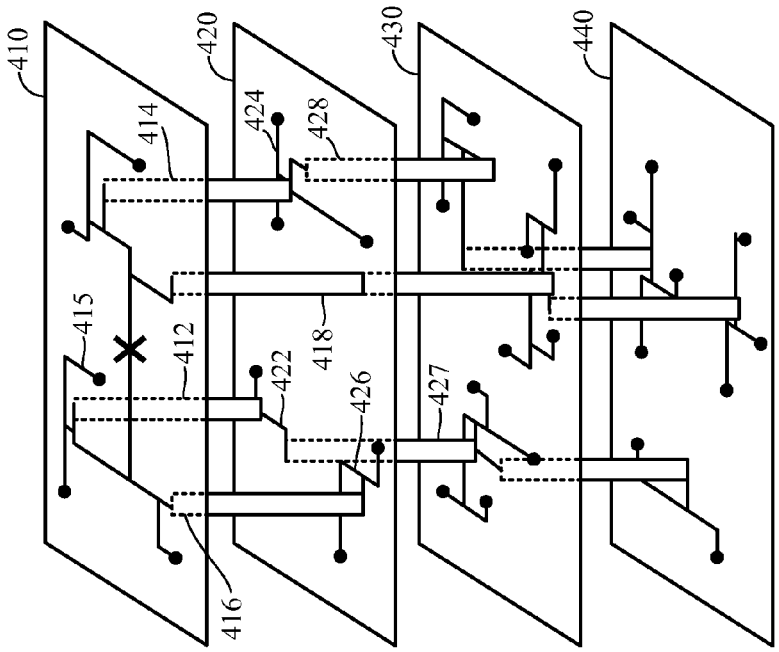
FIG. 4 illustrates an exemplary 3D stacked IC in which one die has a fully connected 2D clock tree and all other dies have multiple isolated subtrees that are connected to subtrees in other dies using multiple TSVs.
Figure 4:
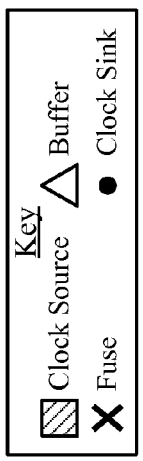

In contrast, FIG. 4 illustrates an exemplary four-die stack designed according to the principles described above with respect to FIGS. 1-3, which may use multiple TSVs because 3D clock trees are generally subject to a TSV versus wirelength (and thus power) tradeoff. More particularly, the total wirelength and power consumption in a 3D clock tree becomes smaller as more TSVs are used, which may motivate using more TSVs in a 3D clock tree. For example, in the four-die stack shown in FIG. 4, one individual die 410 has a fully connected 2D clock tree and the other dies 420, 430, 440 each have multiple small, isolated subtrees that are not connected to one another (e.g., die 420 has three disconnected subtrees 422, 424, 426 and dies 430, 440 likewise have three unconnected subtrees). As such, three TSVs 412, 414, 416 may connect the 2D clock tree 415 in the top-most die 410 to the subtrees 422, 424, 426 in the adjacent die 420, one TSV 418 may connect the 2D clock tree 415 in the top-most die 410 to one subtree in die 430 and two TSVs 427, 428 may connect the subtrees 422, 424 in die 420 to the other two subtrees in die 430, etc. Accordingly, the approach shown in FIG. 4 may take advantages from multiple TSVs to reduce the total wirelength and power consumption. However, the multiple TSV approach shown in FIG. 4 may present pre-bond testing challenges because each clock subtree requires a separate probe pad, meaning that one probe pad can be used to pre-bond test die 410 and many probe pads would be needed to pre-bond test dies 420, 430 440. As such, the following description provides a 3D clock tree synthesis design that may enable low power and low cost pre-bond testing of 3D stacked ICs that use the multiple TSV approach.

Figure 5:
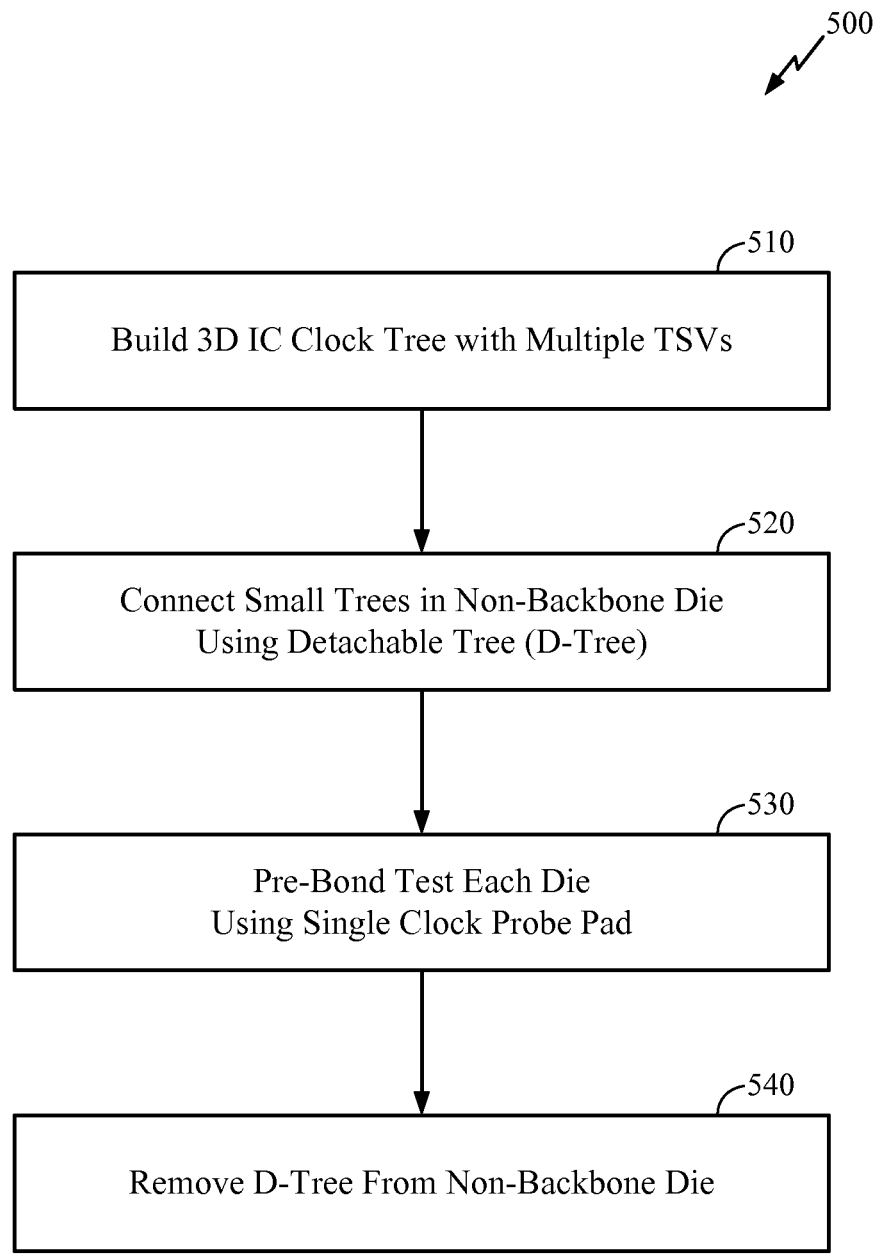
FIG. 5 illustrates an exemplary method for enabling and conducting low cost pre-bond testing of a 3D stacked IC using a Detachable tree (D-tree).

According to various embodiments, FIG. 5 illustrates an exemplary method 500 for low cost pre-bond testing of a 3D stacked IC, wherein the method 500 may generally utilize a Detachable tree (D-tree) to enable the low cost pre-bond testing assuming that the 3D stacked IC has an initial 3D clock tree design in which a backbone die has a fully connected 2D clock tree and one or more non-backbone have multiple isolated 2D clock trees. In that sense, the method 500 may be applied to a 3D IC having an initial clock tree design similar to that shown in FIG. 4, where the backbone die 410 has a fully connected 2D clock tree and one or more non-backbone dies 420, 430, 440 have multiple isolated subtrees that can be connected to one another using the D-tree. In contrast, a 3D IC having an initial clock tree design similar to that shown in FIG. 3 may not be suited to leverage the pre-bond testing methodology 500 shown in FIG. 5 because each die 310, 320, 330, 340 has a fully connected 2D clock tree such that there are no disconnected 2D clock trees in any die 310, 320, 330, 340 that can be connected to one another using the D-tree.

Accordingly, referring to FIG. 5 and assuming a 3D stacked IC having a set of clock sinks distributed across multiple dies, block 510 comprise building an initial 3D clock tree with multiple TSVs to connect all the clock sinks across the multiple dies for post-bond operation. In various embodiments, the initial 3D clock tree may generally have the design mentioned above, in which one die (e.g., a "backbone" die) has a fully connected 2D clock tree, wherein the backbone die may contain the clock source, and further in which each "non-backbone" die comprises multiple unconnected 2D clock trees and multiple TSVs are used to connect all the clock sinks across the backbone die and the one or more non-backbone dies. For example, referring back to FIG. 4, the die 410 that contains the clock source may have a fully connected 2D clock tree 415, each "non-backbone" die 420, 430, 440 may have multiple unconnected 2D clock trees, and multiple TSVs 412, 414, 416, 418, 427, 428, etc. connect the clock sinks across the various dies 410, 420, 430, 440 to create the fully connected initial 3D clock tree that will be used during post-bond operation.

Figure 7A:
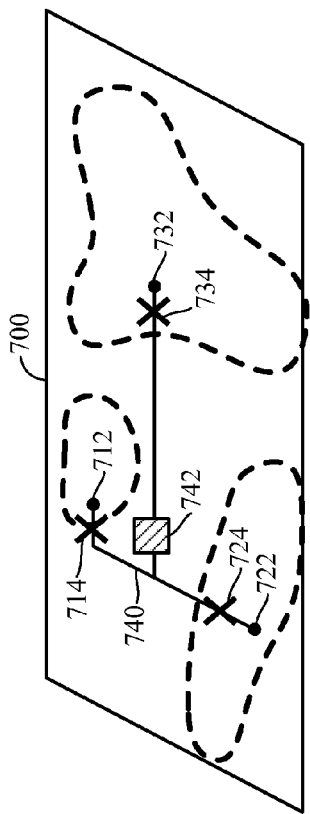
FIGS. 7A-7C illustrate an exemplary non-backbone die that has multiple small trees connected to one another using a D-tree to enable low cost pre-bond testing.
Figure 7B:
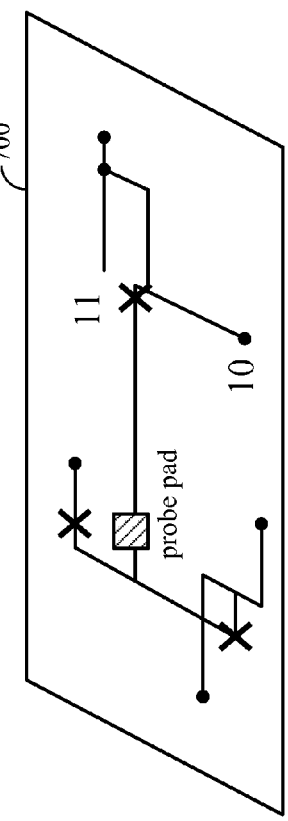
Figure 7C:
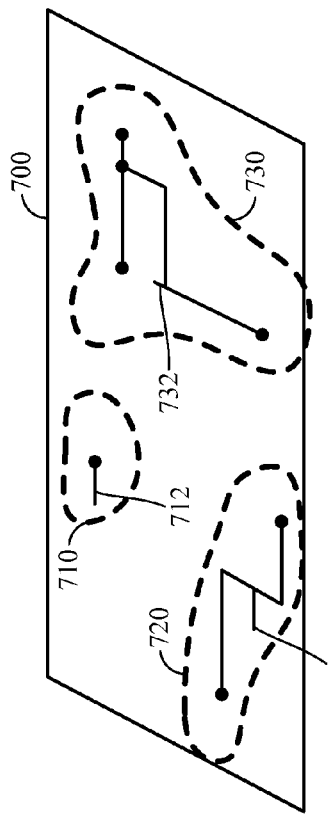

In various embodiments, at block 520, the small subtrees in each non-backbone die may then be connected to one another using a D-tree and no buffer in order to form a single fully connected (pre-bond) 2D clock tree in each non-backbone die. For example, in various embodiments, the D-tree may be built using a wirelength-oriented Steiner router that can find the shortest interconnect among the clock sinks in each non-backbone die. As such, the D-tree may generally comprise a non-buffered Steiner tree (or rectilinear minimum spanning tree) with a root node that may correspond to a probe pad used during pre-bond testing, a vertex at the sink associated with each subtree, and a fuse located at each vertex. For example, referring to FIG. 7A, an exemplary non-backbone die 700 may have three subtrees 710, 720, 730 with respective sinks at 712, 722, 732, and referring to FIG. 7B, an exemplary D-tree 740 that can connect the various subtrees 710, 720, 730 in the non-backbone die 700 may have a root node 742 (i.e., probe pad or clock source) and may further have fuses 714, 724, 734 attached to the respective sinks 712, 722, 732 associated with the various subtrees 710, 720, 730. Accordingly, referring to FIG. 7C, the D-tree 740 may minimize the wirelength and buffer overhead needed to connect the various subtrees 710, 720, 730 in the non-backbone die 700.

In various embodiments, after the D-tree has been created to connect the small subtrees in each non-backbone die at block 520, a single clock probe pad may then be used to pre-bond test each individual die at block 530. For example, in various embodiments, a probe needle may generally touch the clock source in each die during pre-bond testing (e.g., the probe needle may touch the clock source in the backbone die and the D-tree root node that provides the probe pad or clock source in each non-backbone die). After the pre-bond testing has been completed, the D-tree may be removed from the non-backbone die for post-bond testing and post-bond operation at block 540, which may simply involve burning the fuses at the respective sinks.

Figure 6:
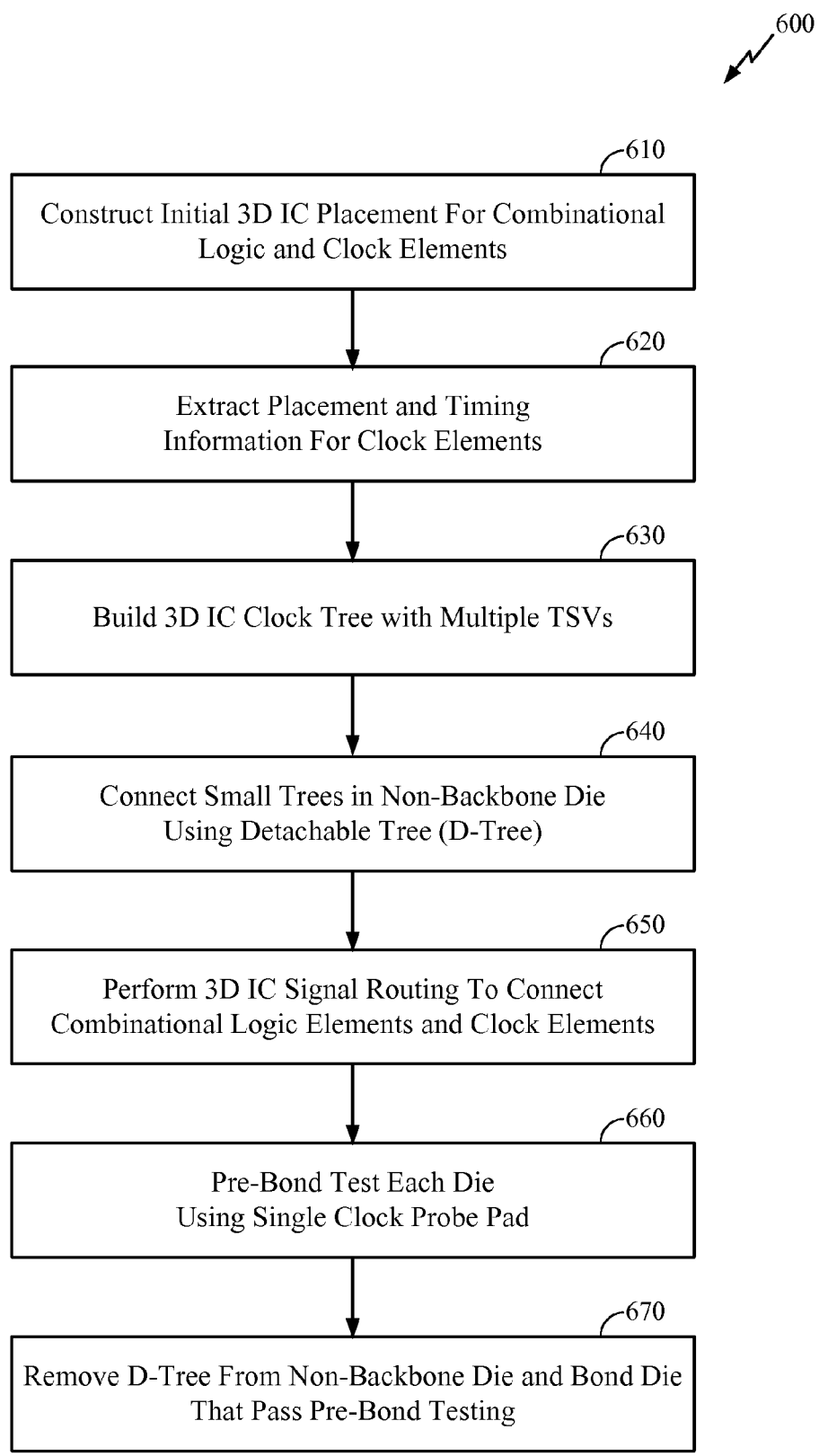
FIG. 6 illustrates an exemplary overall method for fabricating a 3D stacked IC having a 3D clock tree design that may enable low cost pre-bond testing.

According to various embodiments, FIG. 6 illustrates an exemplary overall method 600 for fabricating a 3D stacked IC having a 3D clock tree design that may enable low cost pre-bond testing. In particular, an initial 3D IC placement may be constructed for one or more combinational logic elements and one or more clock elements at block 610, wherein the clock elements may generally comprise a clock source and one or more clock sinks. In various embodiments, at block 620, placement and timing information for the one or more clock elements may be extracted and 3D IC clock routing may then be performed to connect the clock elements while adding one or more additional clock buffers at block 630. For example, assuming a 3D stacked IC having a set of clock sinks distributed across multiple dies, the 3D IC clock routing performed at block 630 may comprise building an initial 3D clock tree with multiple TSVs to connect all the clock sinks across the multiple dies for post-bond operation, wherein the initial 3D clock tree may comprise a fully connected 2D clock tree in a backbone die, multiple isolated 2D clock trees in one or more non-backbone die, and multiple TSVs that connect all the clock sinks across the backbone die and the one or more non-backbone die.

In various embodiments, at block 640, the small subtrees in each non-backbone die may then be connected to one another using a D-tree to form one fully connected 2D clock tree in each non-backbone die. For example, in various embodiments, the D-tree may represent the shortest interconnect among the clock sinks in each non-backbone die and thereby minimize the wirelength needed to connect the small subtrees in each non-backbone die. Furthermore, the D-tree may have a root node that corresponds to a clock source or probe pad to which a probe needle may be touched during pre-bond testing, a vertex at the sink associated with each subtree, and a fuse located at each vertex. In various embodiments, at block 650, 3D IC signal routing may be performed to connect the combinational logic elements that were placed at block 610, to connect the clock elements to the combinational logic elements, and to map the TSVs used to connect the clock elements to corresponding combinational logic elements. In various embodiments, at block 660, a single clock probe pad may then be used to pre-bond test each individual die, which may generally comprise touching a probe needle to the clock source in each die. After the pre-bond testing has been completed, the D-tree(s) used to connect the isolated subtrees in each non-backbone die may be removed at block 670, which may simply involve burning the fuses at the respective sinks, and the die that pass the pre-bond testing may then be bonded to one another for post-bond testing and post-bond operation.

According to various embodiments, FIGS. 8A-8C illustrate an exemplary overall topology, pre-bond test topology, and post-bond operation topology associated with a two-die stacked IC that uses a D-tree to enable low cost pre-bond testing according to the design principles described above. More particularly, FIG. 8A shows an overall fully connected 3D clock tree topology in which a backbone die 810 has a fully connected 2D clock tree 812 and a clock source 842, a non-backbone die 820 has three isolated 2D clock trees 822, 824, 826 and a D-tree 824 that connects the three isolated clock trees 822, 824, 826 to one another, and three TSVs 832, 834, 836 connect the clock tree 812 in the backbone die 810 to the three isolated 2D clock trees 822, 824, 826 in the non-backbone die 820. As shown in FIG. 8B, during pre-bond testing, the backbone die 810 and the non-backbone 820 are separated and tested individually, wherein the fully connected 2D clock tree 812 in the backbone die 810 can be used without any further modification. Furthermore, the D-tree 824 that connects the various subtrees 822, 824, 826 in the non-backbone die 820 may have a root node 844 and fuses located at the sinks associated with the various subtrees 822, 824, 826 in the non-backbone die 820 such that pre-bond testing on the non-backbone die 820 can be performed using one clock probe pad at the root node 844 associated with the D-tree 824. The fuses may then be burned for post-bond operation, which may essentially remove the D-tree 824 from the non-backbone die 820, resulting in the post-bond operation topology shown in FIG. 8C. Furthermore, using fuses to remove the D-tree 824 after pre-bond testing may be advantageous in that fuses are not leaky and tend to be less expensive than other techniques used to span the clock signal across multiple tiers (e.g., buffers, transmission gates, and a global control signal).

Figure 9:
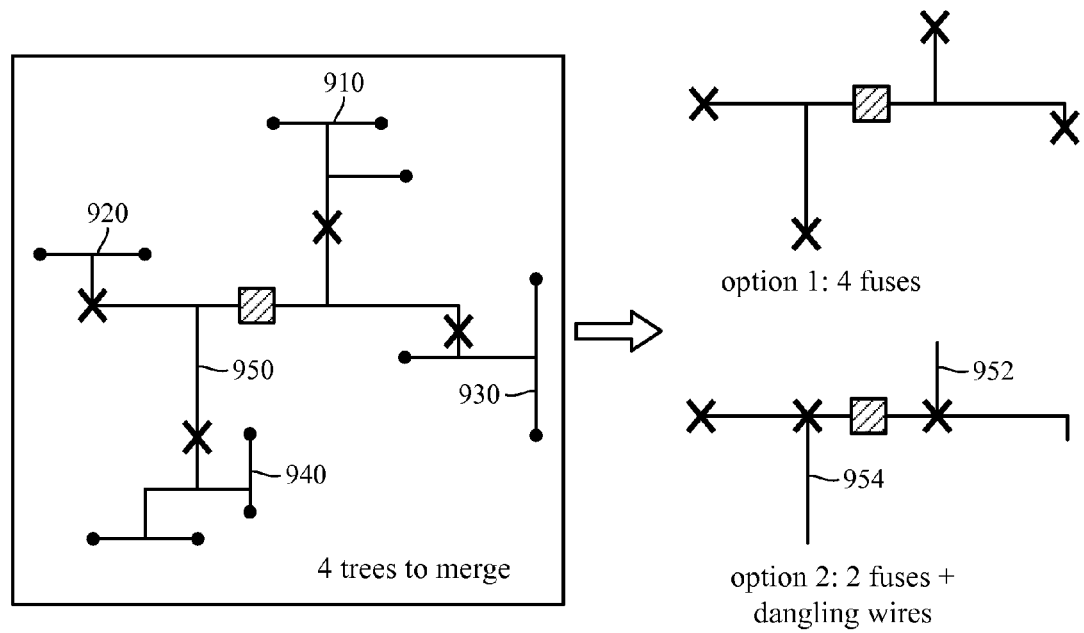
FIG. 9 illustrates exemplary fuse placements to minimize the cost of a D-tree used to connect multiple small trees in a non-backbone die.
Figure 9:
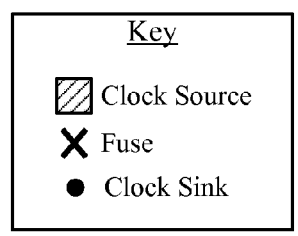

According to various embodiments, FIG. 9 illustrates exemplary options to place the fuses used to remove the D-tree from the non-backbone die after pre-bond testing and thereby minimize the cost associated with the D-tree used to connect the multiple isolated subtrees in the non-backbone die. For example, in order to minimize the cost associated with the D-tree from a wirelength perspective, a wirelength-oriented Steiner router may be used to find a rectilinear minimum spanning tree (RMST) that represents the shortest interconnect among N sinks in a particular non-backbone die, where N is greater than one and represents the number of fuses associated with the D-tree. Furthermore, an appropriate value for N may be chosen in order to further minimize the cost associated with the D-tree according to a usage under area versus power tradeoff. For example, FIG. 9 illustrates a non-backbone die with four subtrees 910, 920, 930, 940 to be merged using a D-tree 950, wherein a first option may be to use four fuses that each correspond to the sink associated with one of the subtrees 910, 920, 930, 940. Alternatively, the number of fuses may be reduced to minimize component costs, power that the fuses consume, or other overhead if the number of subtrees exceeds a threshold value or is otherwise sufficiently high (e.g., four or more). For example, referring to FIG. 9, the second option shows the D-tree with two fuses used to connect the four subtrees 910, 920, 930, 940. However, using fewer fuses may result in dangling wires 952, 954 after pre-bond testing has been carried out and the fuses have been burned to remove the D-tree. Furthermore, in use cases that focus on functional (e.g., not at-speed testing), skew considerations may not be minimized to reduce the buffers and wirelength associated with the pre-bond testing circuitry because increased test time may not be a substantial concern in such cases. However, in other uses, skew can be minimized if desired to reduce the test time, although minimizing skew may result in increased buffers and wirelength (and therefore increased cost).

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those skilled in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted to depart from the scope of the present disclosure.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The methods, sequences and/or algorithms described in connection with the aspects disclosed herein may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in an IoT device. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, DSL, or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes CD, laser disc, optical disc, DVD, floppy disk and Blu-ray disc where disks usually reproduce data magnetically and/or optically with lasers. Combinations of the above should also be included within the scope of computer-readable media.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. A method for pre-bond testing a three-dimensional integrated circuit, comprising:
    building a fully connected two-dimensional (2D) clock tree on a backbone die;
    building multiple isolated 2D clock trees on one or more non-backbone die, wherein multiple through-silicon-vias connect the 2D clock tree in the backbone die and the multiple isolated 2D clock trees in the one or more non-backbone die; and
    connecting the multiple isolated 2D clock trees in the one or more non-backbone die using a Detachable tree (D-tree), wherein the D-tree comprises a root node and fuses located at sinks associated with the isolated 2D clock trees.

2. The method recited in claim 1, further comprising:
    pre-bond testing the one or more non-backbone die using a single clock probe pad, wherein the single clock probe pad used to pre-bond test the one or more non-backbone die corresponds to the root node associated with the D-tree that connects the multiple isolated 2D clock trees on the one or more non-backbone die.

3. The method recited in claim 2, wherein the backbone die and the one or more non-backbone die are separated and tested individually during the pre-bond testing.

4. The method recited in claim 2, further comprising:
    removing the D-tree from the one or more non-backbone die subsequent to the pre-bond testing, wherein removing the D-tree from the one or more non-backbone die comprises burning the fuses at the sinks associated with the 2D clock trees.

5. The method recited in claim 1, wherein the one or more non-backbone die comprise N sinks, where N equals a number of the multiple isolated 2D clock trees on the one or more non-backbone die.

6. The method recited in claim 1, wherein the one or more non-backbone die comprise N sinks, where N is greater than one and less than a number of the multiple isolated 2D clock trees on the one or more non-backbone die.

7. The method recited in claim 1, further comprising:
    determining that a number of the isolated 2D clock trees in at least one of the one or more non-backbone die exceeds a threshold value; and
    reducing a number of the fuses located at the sinks associated with the isolated 2D clock trees in the at least one non-backbone die such that the reduced number of fuses in the at least one non-backbone die is less than the number of the isolated 2D clock trees in the at least one non-backbone die.

8. The method recited in claim 1, wherein the D-tree comprises a rectilinear minimum spanning tree that represents a shortest interconnect among the sinks associated with the multiple isolated 2D clock trees in the one or more non-backbone die.

9. The method recited in claim 1, wherein the D-tree comprises a non-buffered Steiner tree built using a Steiner router configured to minimize wirelength and buffer overhead associated with the D-tree.

10. A three-dimensional (3D) stacked integrated circuit, comprising:
    a backbone die, wherein the backbone die comprises a clock source and a fully connected two-dimensional (2D) clock tree;

one or more non-backbone die that each have multiple isolated 2D clock trees, wherein the multiple isolated 2D clock trees in the one or more non-backbone die are connected to one another with a Detachable tree (D-tree) that comprises a single clock probe pad and fuses attached at sinks associated with the isolated 2D clock trees; and multiple through-silicon-vias that connect the fully connected 2D clock tree in the backbone die to the multiple isolated 2D clock trees in the one or more non-backbone die.

11. The 3D stacked integrated circuit recited in claim 10, wherein the single clock probe pad associated with the D-tree is used to pre-bond test the one or more non-backbone die.

12. The 3D stacked integrated circuit recited in claim 11, wherein the backbone die and the one or more non-backbone die are separated and tested individually during the pre-bond test.

13. The 3D stacked integrated circuit recited in claim 11, wherein the fuses associated with the D-tree are burned subsequent to the pre-bond test to remove the D-tree from the one or more non-backbone die.

14. The 3D stacked integrated circuit recited in claim 10, wherein the one or more non-backbone die comprise N sinks, where N equals a number of the multiple isolated 2D clock trees on the one or more non-backbone die.

15. The 3D stacked integrated circuit recited in claim 10, wherein the one or more non-backbone die comprise N sinks, where N is greater than one and less than a number of the multiple isolated 2D clock trees on the one or more non-backbone die.

16. The 3D stacked integrated circuit recited in claim 10, wherein the D-tree comprises a rectilinear minimum spanning tree that represents a shortest interconnect among the sinks associated with the multiple isolated 2D clock trees in the one or more non-backbone die.

17. The 3D stacked integrated circuit recited in claim 10, wherein the D-tree is built using a Steiner router configured to minimize wirelength and buffer overhead associated with the D-tree.

18. A three-dimensional (3D) stacked integrated circuit, comprising:
a first die comprising a fully connected two-dimensional (2D) clock tree; and
a second die bonded to the first die, wherein the second die comprises multiple isolated 2D clock trees that are connected to the fully connected 2D clock tree in the first die using multiple through-silicon-vias, and wherein the second die further comprises a non-buffered clock tree that has one or more burned fuses.

19. The 3D stacked integrated circuit recited in claim 18, wherein the burned fuses are located at sinks associated with the multiple isolated 2D clock trees in the second die.

20. The 3D stacked integrated circuit recited in claim 18, wherein the burned fuses are located at internal nodes associated with the non-buffered clock tree.

* * * * *